(12) United States Patent
Briere

(10) Patent No.: US 8,981,380 B2
(45) Date of Patent: Mar. 17, 2015

(54) MONOLITHIC INTEGRATION OF SILICON AND GROUP III-V DEVICES

(75) Inventor: Michael A. Briere, Woonsocket, RI (US)

(73) Assignee: International Rectifier Corporation, El Segundo, CA (US)

( * ) Notice: Subject to any disclaimer, the term of this patent is extended or adjusted under 35 U.S.C. 154(b) by 692 days.

(21) Appl. No.: 12/928,103

(22) Filed: Dec. 3, 2010

(65) Prior Publication Data
US 2011/0210337 A1 Sep. 1, 2011

Related U.S. Application Data

(60) Provisional application No. 61/339,190, filed on Mar. 1, 2010.

(51) Int. Cl.
| | |
|---|---|
| *H01L 21/00* | (2006.01) |
| *H01L 27/06* | (2006.01) |
| *H01L 21/8258* | (2006.01) |
| *H03K 17/567* | (2006.01) |
| *H03K 17/74* | (2006.01) |
| *H01L 29/778* | (2006.01) |
| *H01L 29/20* | (2006.01) |

(52) U.S. Cl.
CPC ........ *H01L 27/0629* (2013.01); *H01L 21/8258* (2013.01); *H03K 17/567* (2013.01); *H03K 17/74* (2013.01); *H01L 29/7786* (2013.01); *H01L 29/2003* (2013.01)
USPC .............................. 257/76; 257/77; 257/194

(58) Field of Classification Search
CPC ............ H01L 27/0629; H01L 29/7786; H01L 21/8258; H01L 17/74; H01L 29/2003; H03K 17/567
USPC ...................................... 257/76, 77, 191, 194
See application file for complete search history.

(56) References Cited

U.S. PATENT DOCUMENTS

| 5,021,840 | A | 6/1991 | Morris | |
|---|---|---|---|---|
| 6,433,396 | B1 * | 8/2002 | Kinzer | 257/369 |
| 7,498,617 | B2 * | 3/2009 | Kinzer | 257/192 |
| 7,550,781 | B2 * | 6/2009 | Kinzer et al. | 257/183 |
| 7,745,849 | B2 * | 6/2010 | Briere | 257/192 |
| 7,839,131 | B2 * | 11/2010 | Yang et al. | 323/282 |
| 7,863,877 | B2 * | 1/2011 | Briere | 323/282 |

(Continued)

FOREIGN PATENT DOCUMENTS

| EP | 2 006 991 | 12/2008 |
|---|---|---|
| JP | 2009-4398 | 1/2009 |

(Continued)

*Primary Examiner* — Laura Menz
(74) *Attorney, Agent, or Firm* — Farjami & Farjami LLP

(57) ABSTRACT

Disclosed is a monolithically integrated silicon and group III-V device that includes a group III-V transistor formed in a III-V semiconductor body disposed over a silicon substrate. At least one via extends through the III-V semiconductor body to couple at least one terminal of the group III-V transistor to a silicon device formed in the silicon substrate. The silicon device can be a Schottky diode, and the group III-V transistor can be a GaN HEMT. In one embodiment an anode of the Schottky diode is formed in the silicon substrate. In another embodiment, the anode of the Schottky diode is formed in a lightly doped epitaxial silicon layer atop the silicon substrate. In one embodiment a parallel combination of the Schottky diode and the group III-V transistor is formed, while in another embodiment is series combination is formed.

12 Claims, 4 Drawing Sheets

(56) References Cited

U.S. PATENT DOCUMENTS

| | | | |
|---|---|---|---|
| 7,902,809 B2 * | 3/2011 | Briere et al. | 323/351 |
| 7,915,645 B2 * | 3/2011 | Briere | 257/195 |
| 7,964,895 B2 * | 6/2011 | Briere | 257/192 |
| 7,999,288 B2 * | 8/2011 | Briere | 257/194 |
| 7,999,289 B2 * | 8/2011 | Suzuki et al. | 257/195 |
| 8,063,616 B2 * | 11/2011 | Bahramian et al. | 323/271 |
| 8,072,202 B2 * | 12/2011 | Yang et al. | 323/282 |
| 8,076,699 B2 * | 12/2011 | Chen et al. | 257/194 |
| 8,084,785 B2 * | 12/2011 | Briere | 257/194 |
| 8,093,597 B2 * | 1/2012 | Briere | 257/76 |
| 8,148,964 B2 * | 4/2012 | Briere | 323/282 |
| 8,159,003 B2 * | 4/2012 | Briere | 257/194 |
| 8,168,000 B2 * | 5/2012 | Briere et al. | 117/95 |
| 8,174,051 B2 * | 5/2012 | Cao et al. | 257/200 |
| 8,183,595 B2 * | 5/2012 | Briere | 257/194 |
| 8,216,951 B2 * | 7/2012 | Cheng et al. | 438/143 |
| 8,338,861 B2 * | 12/2012 | Briere et al. | 257/194 |
| 8,390,091 B2 * | 3/2013 | Renaud | 257/471 |
| 8,395,132 B2 * | 3/2013 | Briere | 250/492.3 |
| 8,399,912 B2 * | 3/2013 | Cheah et al. | 257/194 |
| 8,399,913 B2 * | 3/2013 | Suzuki et al. | 257/195 |
| 2005/0189562 A1 * | 9/2005 | Kinzer et al. | 257/192 |
| 2006/0175633 A1 * | 8/2006 | Kinzer | 257/192 |
| 2006/0289876 A1 * | 12/2006 | Briere | 257/86 |
| 2007/0000433 A1 * | 1/2007 | Briere et al. | 117/84 |
| 2007/0026587 A1 * | 2/2007 | Briere | 438/159 |
| 2007/0077714 A1 * | 4/2007 | Beach et al. | 438/285 |
| 2007/0228422 A1 * | 10/2007 | Suzuki et al. | 257/213 |
| 2007/0228477 A1 * | 10/2007 | Suzuki et al. | 257/368 |
| 2008/0083932 A1 * | 4/2008 | Briere | 257/192 |
| 2008/0087917 A1 * | 4/2008 | Briere | 257/194 |
| 2008/0122418 A1 * | 5/2008 | Briere et al. | 323/282 |
| 2008/0136390 A1 * | 6/2008 | Briere | 323/282 |
| 2008/0191216 A1 | 8/2008 | Machida | |
| 2008/0315129 A1 * | 12/2008 | Briere | 250/492.21 |
| 2008/0315257 A1 | 12/2008 | Shiraishi | |
| 2009/0001424 A1 * | 1/2009 | Cao et al. | 257/200 |
| 2009/0050939 A1 * | 2/2009 | Briere | 257/201 |
| 2009/0051225 A1 * | 2/2009 | Yang et al. | 307/113 |
| 2009/0065810 A1 | 3/2009 | Honea | |
| 2009/0072273 A1 * | 3/2009 | Briere | 257/194 |
| 2009/0078964 A1 * | 3/2009 | Briere | 257/192 |
| 2009/0078965 A1 * | 3/2009 | Briere | 257/192 |
| 2009/0166677 A1 | 7/2009 | Shibata | |
| 2009/0180304 A1 * | 7/2009 | Bahramian et al. | 363/124 |
| 2009/0189187 A1 * | 7/2009 | Briere et al. | 257/192 |
| 2009/0189191 A1 * | 7/2009 | Sato et al. | 257/195 |
| 2009/0194793 A1 * | 8/2009 | Briere | 257/201 |
| 2010/0019279 A1 * | 1/2010 | Chen et al. | 257/194 |
| 2010/0065856 A1 * | 3/2010 | Briere | 257/76 |
| 2010/0096668 A1 * | 4/2010 | Briere | 257/194 |
| 2010/0155781 A1 * | 6/2010 | Suzuki et al. | 257/195 |
| 2010/0171126 A1 * | 7/2010 | Briere | 257/76 |
| 2010/0301396 A1 * | 12/2010 | Briere | 257/195 |
| 2011/0074375 A1 * | 3/2011 | Yang et al. | 323/282 |
| 2011/0080156 A1 * | 4/2011 | Briere et al. | 323/351 |
| 2011/0095736 A1 * | 4/2011 | Briere | 323/271 |
| 2011/0121313 A1 * | 5/2011 | Briere | 257/76 |
| 2011/0136325 A1 * | 6/2011 | Briere | 438/478 |
| 2011/0140169 A1 * | 6/2011 | Briere | 257/192 |
| 2011/0140176 A1 * | 6/2011 | Briere | 257/200 |
| 2011/0198611 A1 * | 8/2011 | Cheah et al. | 257/76 |
| 2011/0210337 A1 * | 9/2011 | Briere | 257/76 |
| 2011/0210338 A1 * | 9/2011 | Briere | 257/76 |
| 2011/0223746 A1 * | 9/2011 | Briere | 438/479 |
| 2011/0227090 A1 * | 9/2011 | Briere | 257/76 |
| 2011/0227092 A1 * | 9/2011 | Briere | 257/76 |
| 2011/0260210 A1 * | 10/2011 | Su | 257/103 |
| 2011/0260777 A1 * | 10/2011 | Suzuki et al. | 327/493 |
| 2011/0278598 A1 * | 11/2011 | Renaud | 257/77 |
| 2011/0284868 A1 * | 11/2011 | Briere | 257/76 |
| 2011/0284869 A1 * | 11/2011 | Briere | 257/76 |
| 2012/0062199 A1 * | 3/2012 | Bahramian et al. | 323/282 |
| 2012/0091470 A1 * | 4/2012 | Briere | 257/77 |
| 2012/0138955 A1 * | 6/2012 | Ishiguro et al. | 257/77 |
| 2012/0138956 A1 * | 6/2012 | Shimizu et al. | 257/77 |
| 2012/0205718 A1 * | 8/2012 | Shimizu et al. | 257/194 |
| 2012/0217506 A1 * | 8/2012 | Briere | 257/76 |
| 2012/0223327 A1 * | 9/2012 | Briere | 257/76 |
| 2012/0223365 A1 * | 9/2012 | Briere | 257/194 |
| 2012/0229176 A1 * | 9/2012 | Briere | 327/109 |
| 2012/0235209 A1 * | 9/2012 | Briere et al. | 257/194 |
| 2012/0241820 A1 * | 9/2012 | Briere et al. | 257/195 |
| 2012/0256188 A1 * | 10/2012 | Mcdonald et al. | 257/76 |
| 2012/0256189 A1 * | 10/2012 | Mcdonald et al. | 257/76 |
| 2012/0256190 A1 * | 10/2012 | Mcdonald et al. | 257/76 |
| 2012/0274366 A1 * | 11/2012 | Briere | 327/108 |
| 2012/0293147 A1 * | 11/2012 | Briere | 323/282 |
| 2013/0015498 A1 * | 1/2013 | Briere | 257/191 |
| 2013/0015499 A1 * | 1/2013 | Briere | 257/191 |
| 2013/0015501 A1 * | 1/2013 | Cao et al. | 257/195 |
| 2013/0015905 A1 * | 1/2013 | Briere | 327/434 |
| 2013/0043489 A1 * | 2/2013 | Kotani et al. | 257/77 |
| 2013/0069208 A1 * | 3/2013 | Briere | 257/655 |
| 2013/0074907 A1 * | 3/2013 | Saunders | 136/249 |
| 2013/0105814 A1 * | 5/2013 | Briere et al. | 257/76 |

FOREIGN PATENT DOCUMENTS

| | | |
|---|---|---|
| JP | 2009-246045 | 10/2009 |
| JP | 2011187953 A * | 9/2011 |
| WO | WO 2008/116038 | 9/2008 |

* cited by examiner

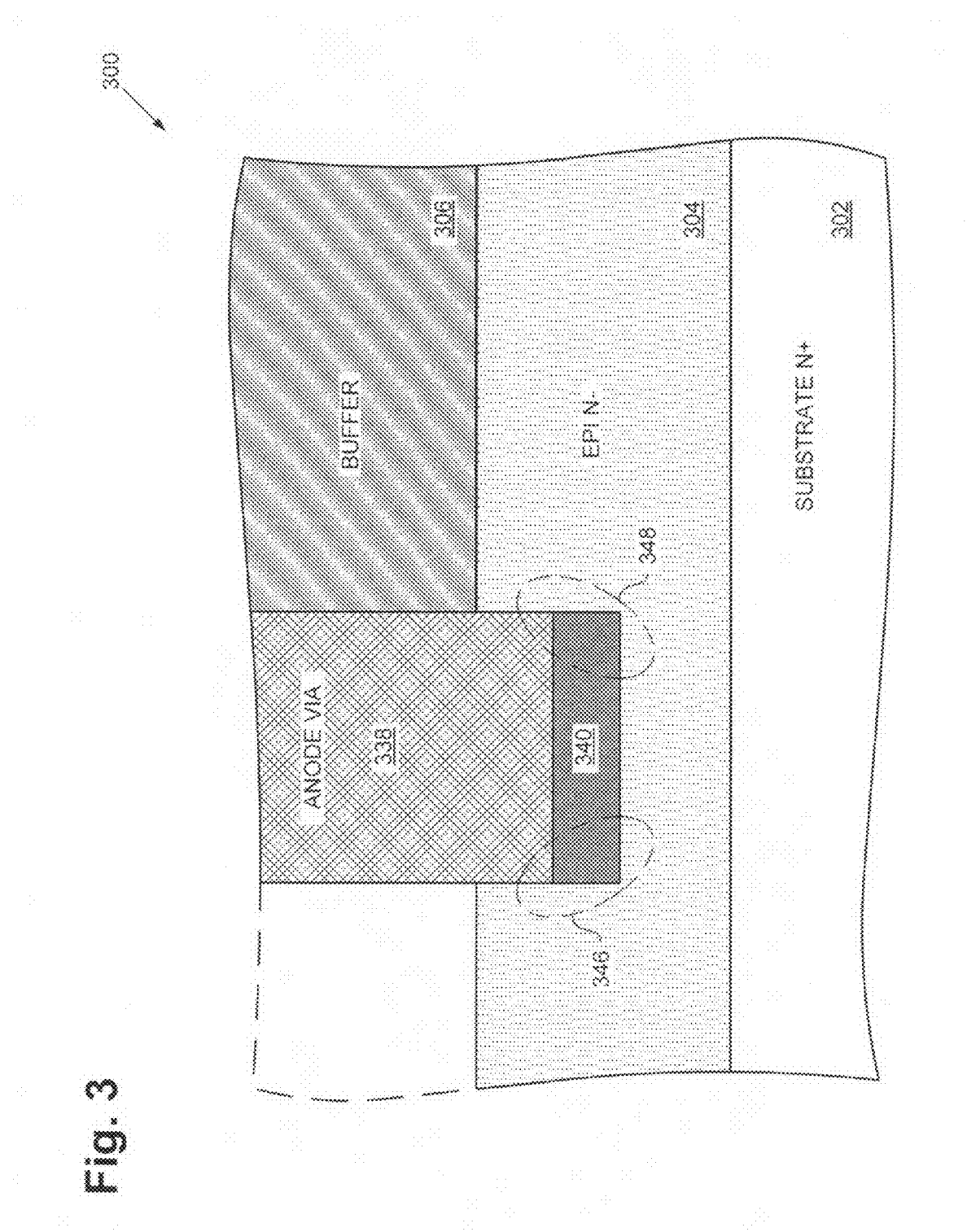

MONOLITHIC INTEGRATION OF SILICON AND GROUP III-V DEVICES

The present application claims the benefit of and priority to a pending provisional application entitled "Monolithic Integration of Silicon and Group III-V Devices and Efficient Circuits Utilizing Same," Ser. No. 61/339,190 filed on Mar. 1, 2010. The disclosure in that pending provisional application is hereby incorporated fully by reference into the present application.

DEFINITION

In the present application, "group semiconductor" or "group III-V device" or similar terms refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

BACKGROUND OF THE INVENTION

1. Field of the Invention

The present invention relates generally to semiconductor device fabrication, and more particularly to silicon and group III-V semiconductor device fabrication.

2. Background Art

GaN HEMTs (Gallium Nitride High Electron Mobility Transistors), or generally III-nitride HEMTs, GaN FETs, or III-nitride transistors (and even more generally group III-V transistors), are known and utilized due to, for example, their high breakdown voltage and high switching speed. The group III-V transistors can be used in conjunctions with silicon devices in various circuits. For example, a particular silicon device, which can be used with group III-V transistors, is a silicon diode, such as a silicon Schottky diode. In a particular application, the silicon diode can be arranged in parallel with a group III-V transistor, where the anode of the silicon diode is connected to the source of the group III-V transistor and the cathode of the silicon diode is connected to the drain of the group III-V transistor. In another application, the silicon diode can be arranged in series with a group III-V transistor, where the cathode of the silicon diode is connected to the source of the group III-V transistor.

However, the fabrication of group III-V devices, such as, GaN transistors, is often not compatible with popular and commonly used silicon devices. Thus, GaN (or III-nitride) devices, for example, are often manufactured separate from silicon devices, typically resulting in two dies (for example a GaN die and a silicon die), which must be interconnected at the package level. The separate dies increase fabrication cost, packaging cost, area consumed on a PC board, and result in increased parasitic inductance, capacitance and resistance due to interconnections required at the packaging level and the PC board level. Moreover, due to increased assembly cost and complexity, and reduced throughput, the separate dies present severe disadvantages.

Thus, there is a need to overcome the drawbacks and deficiencies in the art by providing a solution where, for example, a semiconductor device can include a silicon device monolithically integrated with a group III-V device.

SUMMARY OF THE INVENTION

The present invention is directed to monolithic integration of silicon and group III-V semiconductor devices, substantially as shown in and/or described in connection with at least one of the figures, and as set forth more completely in the claims.

BRIEF DESCRIPTION OF THE DRAWINGS

FIG. 3 shows an expanded view of a portion of an exemplary monolithically integrated device, in accordance with one embodiment of the present invention, corresponding to the monolithically integrated device in FIG. 2B.

DETAILED DESCRIPTION OF THE INVENTION

The present invention is directed to monolithic integration of silicon and group III-V semiconductor devices. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
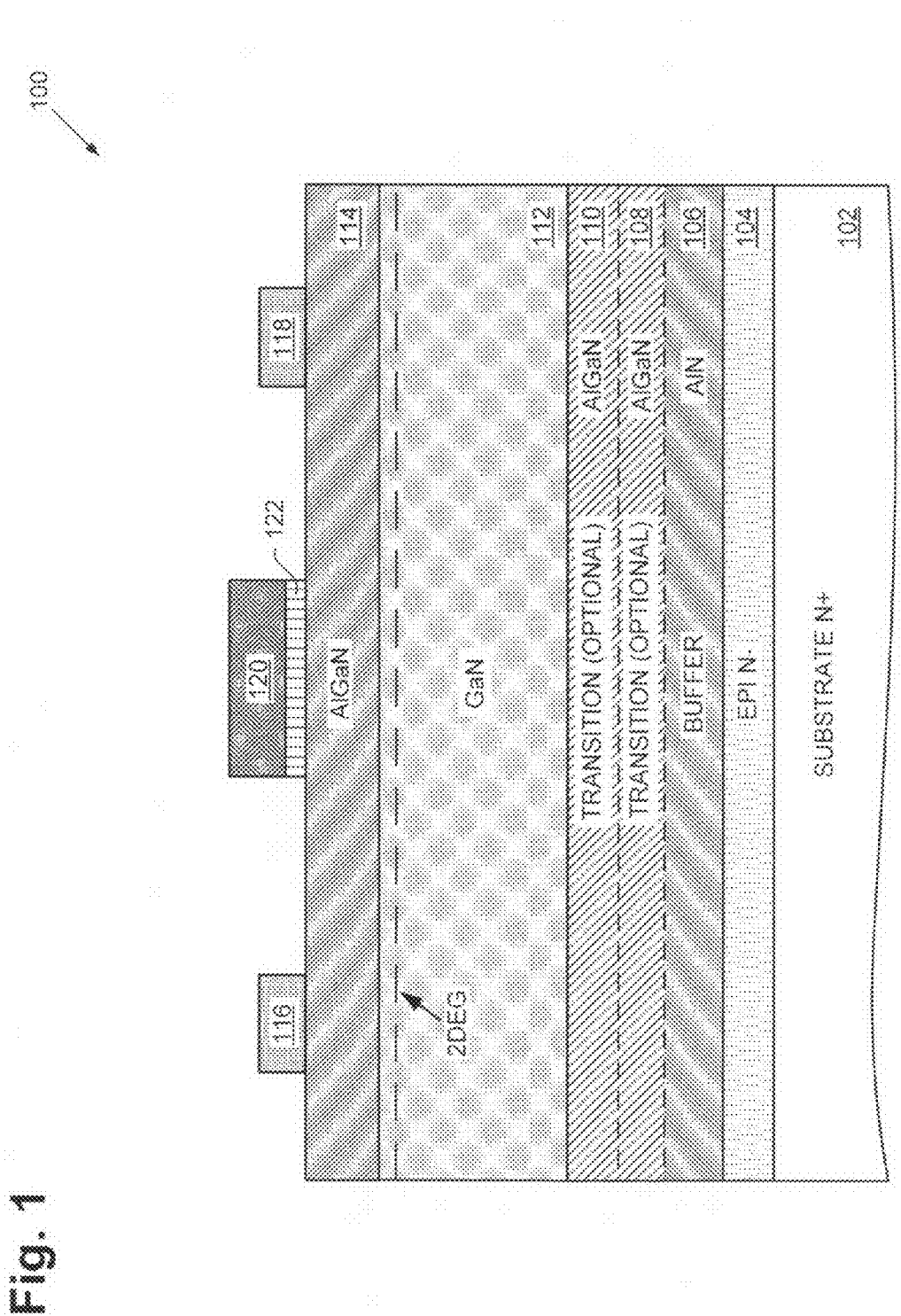
FIG. 1 shows a cross-sectional view of an exemplary group III-V semiconductor device.

FIG. 1 shows a cross-sectional view of exemplary group III-V semiconductor device 100, and more particularly shows a III-Nitride high electron mobility transistor (HEMT). In other embodiments group III-V semiconductor device 100 can comprise, for example, a III-nitride FET, or other group III-V transistors not specifically discussed herein. Substrate N+ 102 is shown, which can be a silicon layer in a silicon substrate heavily doped with N+dopants, or it can be a silicon N+ doped layer epitaxially grown on a substrate of sapphire or silicon carbide. A lightly doped epitaxial silicon layer shown as Epi N– layer 104 is formed atop Substrate N+ 102.

As shown in FIG. 1, group III-V semiconductor device 100 further includes buffer layer 106, which can be, for example, an aluminum nitride (AlN) layer, situated over Epi N– layer 104. In group III-V semiconductor device 100, optional transition layers, such as transition layers 108 and 110 comprising aluminum gallium nitride (AlGaN), can be formed over the AlN layer with varying amounts of aluminum concentration. In the example shown, the aluminum concentration of the transition layers is higher closer to buffer layer 106 and lower closer to GaN layer 112. Thus, transition layer 108 generally has a greater aluminum concentration relative to transition layer 110.

Also shown in FIG. 1, gallium nitride (GaN) layer 112 is formed over buffer layer 106, or over the optional transition layers in some embodiments. Furthermore, a relatively thin AlGaN layer 114 is formed over GaN layer 112. At the interface of AlGaN layer 114 and GaN layer 112 a two-dimensional electron gas (2DEG) is created, as known in the art.

In the present example, group III-V semiconductor device 100 includes source electrode (also referred to as "source terminal") 116 and drain electrode 118 (also referred to as "drain terminal") and gate electrode 120 formed over gate insulator 122. While FIG. 1 shows an insulated gate, the gate of group III-V semiconductor device 100 does not have to be an insulated gate. For example, in other embodiments the gate can be a Schottky gate. Also, various embodiments of group III-V semiconductor device 100 can be made to operate as a depletion mode device (normally on) or an enhancement mode device (normally off).

Although group III-V semiconductor devices, such as, group III-V semiconductor device 100, are known and used due to, for example, their high breakdown voltage and high switching speed, their fabrication is often not compatible with popular and commonly used silicon devices. Fabrication of group III-V semiconductor devices, for example, GaN (or III-nitride) devices, separate from silicon devices, typically results in two dies (for example a GaN die and a silicon die), which must be interconnected at the package level. The separate dies increase fabrication cost, packaging cost, area consumed on a PC board, and result in increased parasitic inductance, capacitance and resistance due to interconnections required at the packaging level and the PC board level. Moreover, due to increased assembly cost and complexity, and reduced throughput, the separate dies present severe disadvantages.

In one embodiment, the invention provides a III-nitride device (for example a GaN HEMT) monolithically integrated (i.e. integrated on a common substrate of a common die) with a silicon device. Such monolithic integration is disclosed by reference to a popular circuit used in high voltage, high power applications, that is the example of a silicon Schottky diode coupled in parallel with the source and drain of a GaN HEMT. In another example, the silicon Schottky diode is coupled in series with the GaN HEMT. The resulting monolithically integrated device can be used, for example, in a number of high voltage, high power switching applications. In one embodiment, a silicon P-N junction diode can be used instead of the silicon Schottky diode used in the present exemplary embodiment.

Figure 2A:
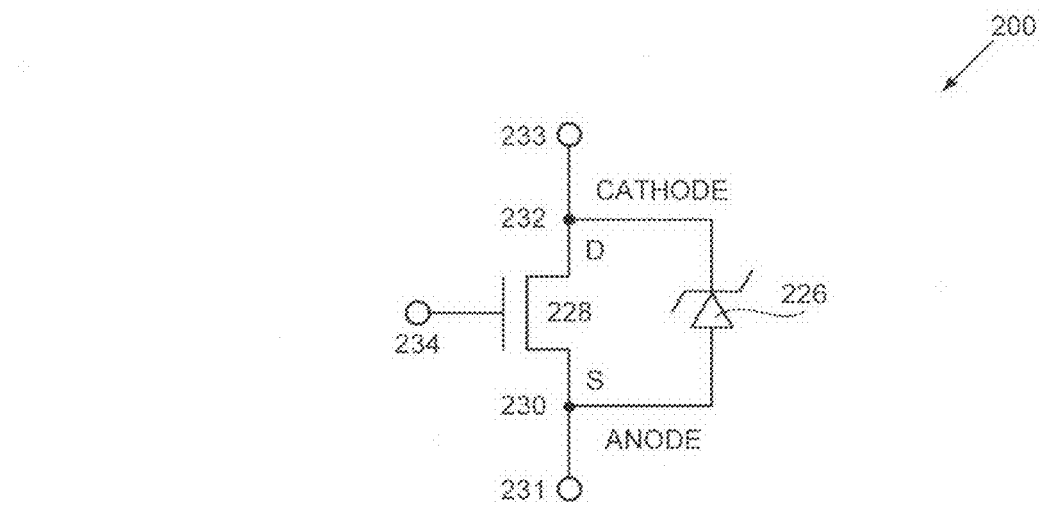
FIG. 2A shows an exemplary circuit, including a silicon device and a group III-V transistor, which can be implemented according to one embodiment of the present invention.

Referring now to FIG. 2A, FIG. 2A shows an exemplary circuit, including a silicon device and a group III-V transistor, which can be implemented according to one embodiment of the present invention. In FIG. 2A, exemplary circuit 200 comprises silicon Schottky diode 226 coupled in parallel with the source and drain of GaN HEMT 228. As shown in FIG. 2A, the anode of silicon Schottky diode 226 is connected to the source of GaN HEMT 228 at node 230, while the cathode of silicon Schottky diode 226 is connected to the drain of GaN HEMT 228 at node 232. Circuit 200 is shown having three terminals which can be connected to external circuits: terminal 233 connected to node 232, terminal 231 connected to node 230, and terminal 234 connected to the gate of GaN HEMT 228. In conventional implementations of circuit 200, Schottky diode 226 and GaN HEMT 228 comprise discrete electrical components formed on different substrates of different dies. However, the present invention provides for monolithic integration of silicon Schottky diode 226 and GaN HEMT 228, for example, as shown and described in relation to FIG. 2B.

Figure 2B:
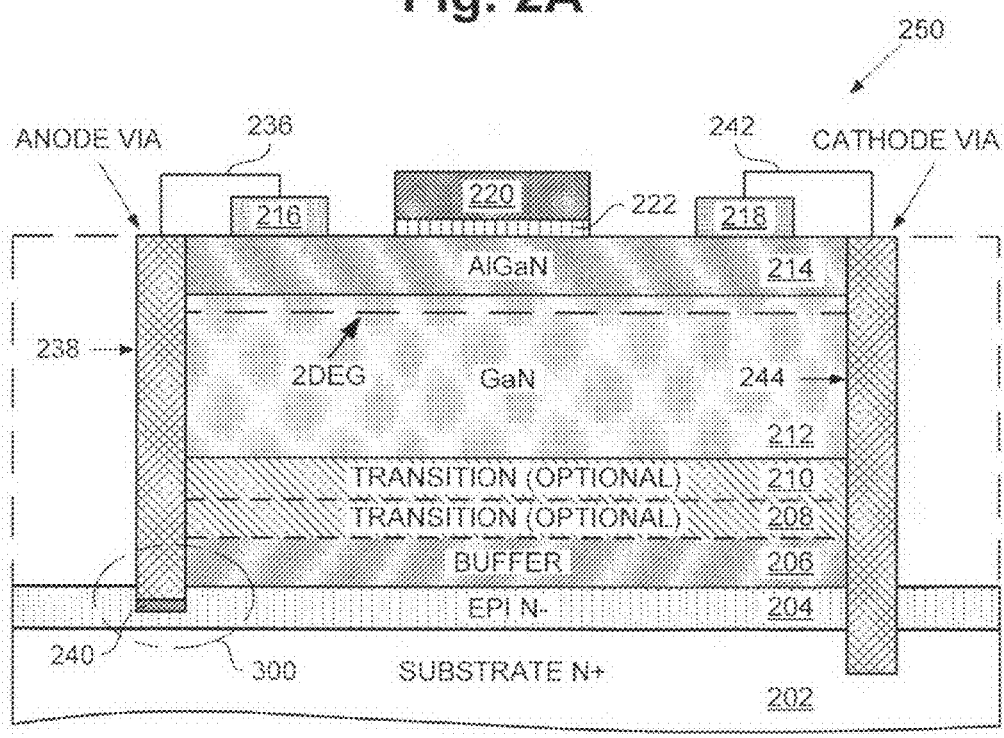
FIG. 2B shows an exemplary monolithically integrated device, in accordance with one embodiment of the present invention, corresponding to the circuit in FIG. 2A.

Referring to FIG. 2B, FIG. 2B shows an exemplary monolithically integrated device, in accordance with one embodiment of the present invention, corresponding to the circuit in FIG. 2A. In FIG. 2B, GaN HEMT structure 250 includes a group III-V transistor formed over "substrate N+ 202," i.e. a heavily doped N type silicon substrate in the present example. Various features of GaN HEMT structure 250 in FIG. 2B have been discussed in relation to FIG. 1 and are not repeated in relation to FIG. 2B. For example, elements in FIG. 2B can correspond to elements having similar reference numerals in FIG. 1. In other words, AlGaN layer 214, GaN layer 212, and transition layers 210 and 208 can correspond to AlGaN layer 114, GaN layer 112, and transition layers 110 and 108 in FIG. 1, and so on. Although GaN HEMT structure 250 is used as an example, the invention's concepts apply to GaN FETs, as wells as HEMTs and FETs made by use of different III-nitride or group III-V transistor structures.

As shown in FIG. 2B, source 216 (also referred to as "source terminal") of GaN HEMT structure 250 is connected to Epi N− layer 204, a lightly doped epitaxially grown silicon region, through interconnect metal connection 236 and via 238, referred to as an "anode via," in FIG. 2B. Metal contact 240, at the bottom of anode via 238, comprises Schottky metal, for example, platinum, aluminum or other appropriate metals. In one embodiment, Epi N− layer 204 is not used, and anode via 238 reaches silicon substrate 202.

A Schottky diode is produced in region 300 of Epi N− layer 204, which is circled in FIG. 2B and shown in more detail as expanded structure 300 in FIG. 3. Drain 218 (also referred to as "drain terminal") of GaN HEMT structure 250 is connected through interconnect metal connection 242 and via 244, referred to as a "cathode via," to substrate N+ 202, for example to an N+ silicon layer 202. Thus, the anode of silicon Schottky diode 226 in FIG. 2A can correspond to metal contact 240, and the cathode of silicon Schottky diode 226 in FIG. 2A can correspond to substrate N+ 202 connected to drain 218 through cathode via 244.

In GaN HEMT structure 250, anode via 238 extends along the group III-V transistor to contact the anode of the silicon diode and cathode via 244 and cathode via 244 extends along the group III-V transistor to contact the cathode of the silicon diode. Anode and cathode vias 238 and 244 generally do not have the same depth. It is preferable that metal contact 240 contact Epi N− layer 204 instead of substrate N+ 202, since the interface of metal contact 240 and substrate N+ 202 would have too high of a reverse bias leakage current and would also have reduced break down voltage. Thus, metal contact 240 can interface with Epi N− layer 204 to produce good Schottky contact and to support a higher breakdown voltage. Epi N− layer 204 can be, for example, about 0.5 to 10 microns thick. By making Epi N− layer 204 thicker, the breakdown voltage of the device can be increased.

It is noted that in FIG. 2A, the source of GaN HEMT 228 is coupled to the anode of silicon Schottky diode 226 at node 230, which can correspond to connection 236 in FIG. 2B. Connection 236 can be made by use of contacts and interconnect metal in various forms and layouts and techniques as known in the art. Similarly, in FIG. 2A the drain of GaN HEMT 228 is coupled to the cathode of silicon Schottky diode 226 at node 232, which can correspond to connection 242 in FIG. 2B. Connection 242 can be made by use of contacts and interconnect metal in various forms and layouts and techniques as known in the art. It is also noted that, similar to group III-V semiconductor device 100 in FIG. 1, GaN HEMT structure 250 in FIG. 2B can be an enhancement mode or depletion mode FET.

To further improve breakdown voltage, for example, to raise breakdown voltage above 30 or 40 volts, reference is made to FIG. 3, which shows an expanded view of region 300 showing the Schottky diode structure in more detail. In FIG. 3, substrate N+ 302, Epi N− layer 304, buffer 306, anode via 338, and metal contact 340 correspond respectively to substrate N+ 202, Epi N− layer 204, buffer layer 206, anode via 238, and metal contact 240 in FIG. 2.

To overcome early breakdown at corners 346 and 348 of the Schottky diode, P+ regions, for example, angled P+ implants can be used adjacent corners 346 and 348 where metal contact 340 would be deposited. According to a preferred method, immediately prior to filling anode via 338, P+ angled implanting is performed at corners 346 and 348 of the trench. Typical P+ dopants, such as Boron can be used. The sealing of corners 346 and 348 with P+ regions results in a "merged Schottky" device, which combines a P-N junction with the Schottky diode. Instead of implanting P+ dopants, the center region of the anode can be blocked or masked so that P+ dopants can only diffuse into the corners of the region where metal contact 340 would interface with Epi N− layer 304. The combined device is a Schottky diode with P-N junctions at corners 346 and 348. There is still a Schottky action in the center of metal contact 340 situated between the P+ regions.

P+ regions at corners 346 and 348 increase breakdown voltage capability for two reasons. First, the P-N junctions (i.e. at corners 346 and 348) help spread-out the electric field to reduce electric field crowding at corners 346 and 348. Second, when the Schottky diode is reverse biased, there would be extended depletion regions near corners 346 and 348 at the P+ regions, which pinch off the Schottky diode and reduce the reverse leakage current so that higher voltages can be used due to a lower leakage current and higher breakdown voltage of this merged Schottky diode and P-N junction configuration. In a particular example, P+ regions at corners 346 and 348 can raise breakdown voltage of the Schottky diode to 100 volts or more.

It is noted that use of a silicon Schottky diode, as opposed to a GaN Schottky diode presents advantages. For example, the forward bias voltage of the silicon Schottky diode is much lower than the forward bias voltage of a GaN Schottky diode. Moreover, to make GaN Schottky diodes, metals such as gold or copper or nickel are needed for Schottky metal in metal contact 340, which are not generally compatible with silicon processing. The monolithic integrated device of the present invention can however be fabricated in a silicon fabrication house, thus resulting in significant cost savings. As noted above, in one embodiment, a silicon P-N junction diode can be used instead of the silicon Schottky diode used in the above exemplary embodiment.

Figure 4A:
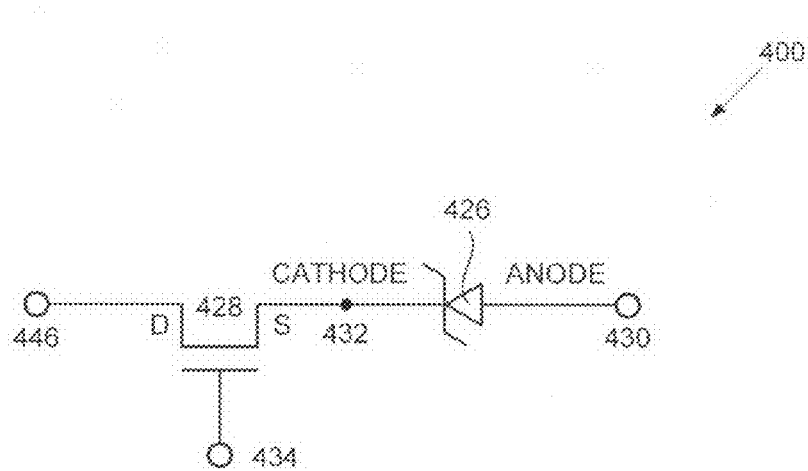
FIG. 4A shows an exemplary circuit, including a silicon device and a group III-V transistor, which can be implemented according to one embodiment of the present invention.

Referring now to FIG. 4A, FIG. 4A shows an exemplary circuit, including a silicon device and a group III-V transistor, which can be implemented according to one embodiment of the present invention. In FIG. 4A, exemplary circuit 400 comprises silicon Schottky diode 426 coupled in series with GaN HEMT 428 to produce an efficient and high voltage rectifier device. FIG. 4A shows that the cathode of silicon Schottky diode 426 is connected to source of GaN HEMT 428 at node 432. Circuit 400 is shown having three terminals which can be connected to external circuits: terminal 430 connected to the anode of silicon Schottky diode 426, terminal 434 connected to the gate of GaN HEMT 428, and terminal 446 connected to the drain of GaN HEMT 428.

Figure 4B:
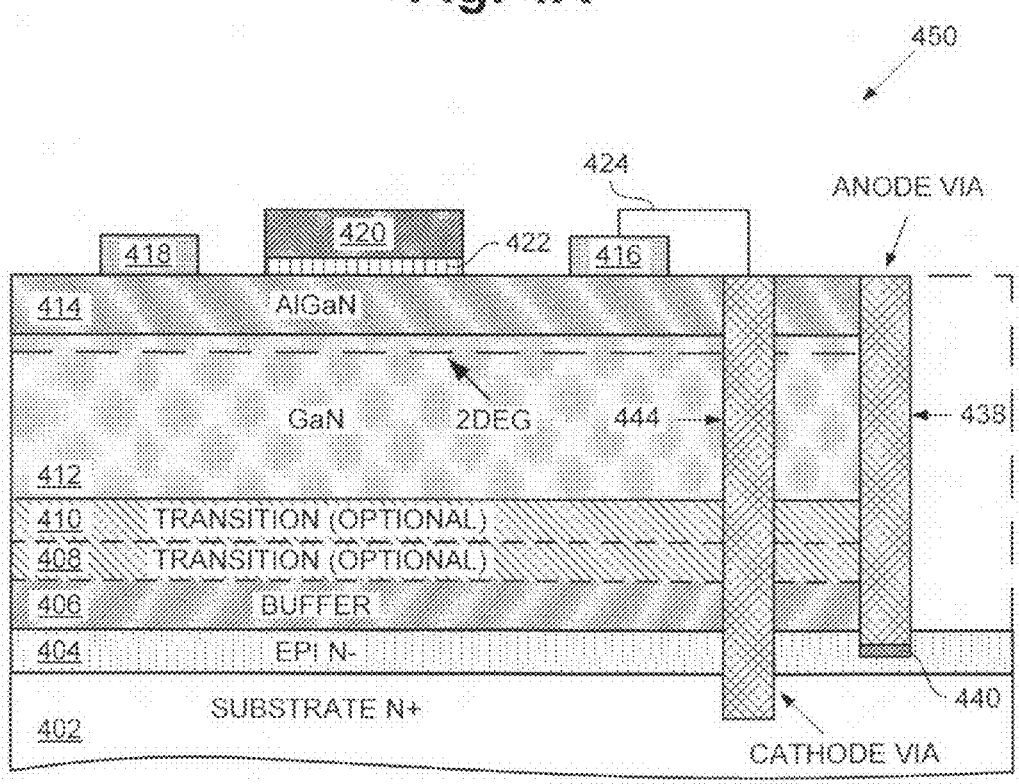
FIG. 4B shows an exemplary monolithically integrated device, in accordance with one embodiment of the present invention, corresponding to the circuit in FIG. 4A.

Now Referring to FIG. 4B, FIG. 4B shows an exemplary monolithically integrated device, in accordance with one embodiment of the present invention, corresponding to circuit 400 in FIG. 4A. The monolithically integrated structure is shown in FIG. 4B as GaN HEMT structure 450 and will be briefly discussed since, in many aspects, this series structure is similar to the parallel structure of FIG. 2B. For example, elements in FIG. 4B can correspond to elements having similar reference numerals in FIG. 2B. In other words, AlGaN layer 414, GaN layer 412, and transition layers 410 and 408 can correspond to AlGaN layer 214, GaN layer 212, and transition layers 210 and 208 in FIG. 2B and so on.

As shown in FIG. 4B, anode via 438 extends to Epi N− layer 404 and is coupled to the anode of the silicon Schottky diode, which is formed by metal contact 440 at the bottom of anode via 438. The top surface of anode via 438 can be connected by interconnect metal to ground or an external node (not shown in FIG. 4B). The cathode of the silicon Schottky diode is routed by cathode via 444 to the top surface of the die and is connected to source 416 of GaN HEMT 450 by interconnect metal represented by connection 424, which can correspond to node 432 in FIG. 4A. In one embodiment, a silicon P-N junction diode can be used instead of the silicon Schottky diode used in the present exemplary embodiment.

Thus, a monolithically integrated structure for implementing the series connection of a silicon Schottky diode and a GaN HEMT (or other group III-V transistor) is disclosed, which results in a high voltage and efficient rectifier device. Other aspects of implementation discussed in relation to FIG. 2B can also be used in relation to FIG. 4B, but are not specifically repeated or discussed here.

According to various embodiments as discussed above, the present invention achieves silicon devices monolithically integrated with GaN (or generally group III-V) devices. Thus, according to the present invention, group III-V semiconductor devices can be fabricated with silicon only devices on a single die, thereby reducing fabrication cost, packaging cost, and area consumed on a PC board. Furthermore, parasitic inductance, capacitance, and resistance can be reduced by removing interconnections at the packaging level and the PC board level. In one example, a monolithically integrated device comprises a silicon Schottky diode and a group III-V semiconductor device connected in parallel to form a high voltage and efficient power switch. In another example, silicon Schottky diode and group III-V semiconductor device are connected in series to form a high voltage and efficient rectifier device.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A monolithically integrated silicon and group III-V device comprising:
   a group III-V transistor formed in a group III-V semiconductor body disposed over a silicon substrate;
   at least one via extending through said group III-V semiconductor body to couple at least one terminal of said group III-V transistor to a silicon device formed in said silicon substrate;

said group III-V transistor and said silicon device configured to be one of coupled in series and coupled in parallel with one another, wherein said silicon device is not electrically connected to a gate of said group III-V transistor.

2. The monolithically integrated silicon and group III-V device of claim 1 wherein said silicon device comprises a Schottky diode.

3. The monolithically integrated silicon and group III-V device of claim 1 wherein said silicon device comprises a Schottky diode, and said group III-V transistor is a GaN HEMT.

4. The monolithically integrated silicon and group III-V device of claim 1 wherein said silicon device comprises a Schottky diode, and said group III-V transistor is a GaN HEMT, and wherein an anode of said Schottky diode is formed in said silicon substrate.

5. The monolithically integrated silicon and group III-V device of claim 4 wherein said anode of said Schottky diode is formed in a lightly doped epitaxial silicon layer atop said silicon substrate.

6. The monolithically integrated silicon and group III-V device of claim 4 wherein said anode of said Schottky diode comprises a metal selected from the group consisting of platinum and aluminum.

7. The monolithically integrated silicon and group III-V device of claim 4 wherein said anode of said Schottky diode is routed to a source terminal of said group III-V transistor by an anode via.

8. The monolithically integrated silicon and group III-V device of claim 1 wherein said silicon device comprises a Schottky diode, and said group III-V transistor is a GaN HEMT, and wherein a cathode of said Schottky diode is formed in said silicon substrate.

9. The monolithically integrated silicon and group III-V device of claim 8 wherein said cathode of said Schottky diode is routed to a drain terminal of said group III-V transistor by a cathode via.

10. The monolithically integrated silicon and group III-V device of claim 2 wherein a cathode of said Schottky diode is routed to a drain terminal of said group III-V transistor by a cathode via, and an anode of said Schottky diode is coupled to a source terminal of said group III-V transistor, thereby forming a parallel combination of said group III-V transistor and said Schottky diode.

11. The monolithically integrated silicon and group III-V device of claim 2 wherein a cathode of said Schottky diode is routed to a source terminal of said group III-V transistor by a cathode via, and an anode of said Schottky diode is not coupled to a drain terminal of said group III-V transistor, thereby forming a series combination of said group III-V transistor and said Schottky diode.

12. The monolithically integrated silicon and group III-V device of claim 1 wherein said silicon device comprises a P-N junction diode.

* * * * *